(12) United States Patent
Otake et al.

(10) Patent No.: US 12,550,356 B2
(45) Date of Patent: Feb. 10, 2026

(54) NITRIDE SEMICONDUCTOR DEVICE AND METHOD FOR MANUFACTURING SAME

(71) Applicant: ROHM CO., LTD., Kyoto (JP)

(72) Inventors: Hirotaka Otake, Kyoto (JP); Kentaro Chikamatsu, Kyoto (JP); Shinya Takado, Kyoto (JP); Kazuya Nagase, Kyoto (JP)

(73) Assignee: ROHM CO. LTD., Kyoto (JP)

( * ) Notice: Subject to any disclaimer, the term of this patent is extended or adjusted under 35 U.S.C. 154(b) by 1044 days.

(21) Appl. No.: 17/603,849

(22) PCT Filed: Mar. 6, 2020

(86) PCT No.: PCT/JP2020/009797
§ 371 (c)(1),
(2) Date: Oct. 14, 2021

(87) PCT Pub. No.: WO2020/213291
PCT Pub. Date: Oct. 22, 2020

(65) Prior Publication Data
US 2022/0209001 A1 Jun. 30, 2022

(30) Foreign Application Priority Data
Apr. 15, 2019 (JP) .................. 2019-077283

(51) Int. Cl.
*H10D 30/47* (2025.01)
*H10D 30/01* (2025.01)
(Continued)

(52) U.S. Cl.
CPC ......... *H10D 30/475* (2025.01); *H10D 30/015* (2025.01); *H10D 62/8503* (2025.01); *H10D 64/251* (2025.01)

(58) Field of Classification Search
CPC ............ H01L 29/7786; H01L 29/2003; H01L 29/41725; H01L 29/66462; H01L 29/0657;
(Continued)

(56) References Cited

U.S. PATENT DOCUMENTS 4,994,873 A 2/1991 Madan
5,182,619 A 1/1993 Pfiester
(Continued)

FOREIGN PATENT DOCUMENTS

CN 103715240 A 4/2014
CN 103972284 A 8/2014
(Continued)

OTHER PUBLICATIONS

Office Action issued for Taiwanese Patent Application No. 109112322, dated Jan. 17, 2023, 42 pages including English machine translation.
(Continued)

*Primary Examiner* — Norman D Richards
(74) *Attorney, Agent, or Firm* — XSENSUS LLP

(57) ABSTRACT

A nitride semiconductor device 1 includes a first nitride semiconductor layer 4 that constitutes an electron transit layer, a second nitride semiconductor layer 5 that is formed on the first nitride semiconductor layer and constitutes an electron supply layer, and a gate portion 20 that is formed on the second nitride semiconductor layer. The gate portion 20 includes a semiconductor gate layer 21 of a ridge shape that is formed on the second nitride semiconductor layer and is constituted of a nitride semiconductor containing an acceptor type impurity and a gate electrode 22 that is formed on the semiconductor gate layer. The semiconductor gate layer is constituted of a gate layer main body portion 211 that is formed on the second nitride semiconductor layer and an (Continued)

upper protruding portion 212 that is formed on a width intermediate portion of an upper surface of the gate layer main body portion, and the gate electrode is formed on a top surface of the upper protruding portion.

19 Claims, 14 Drawing Sheets

(51) Int. Cl.
  *H10D 62/85* (2025.01)
  *H10D 64/23* (2025.01)
(58) Field of Classification Search
  CPC . H01L 29/1066; H01L 29/402; H10D 30/475; H10D 30/015; H10D 62/8503; H10D 62/343
  See application file for complete search history.

(56) References Cited

U.S. PATENT DOCUMENTS

| | | | |
|---|---|---|---|
| 2008/0149965 | A1 | 6/2008 | Kaibara et al. |
| 2010/0258843 | A1* | 10/2010 | Lidow ............... H01L 29/66462 257/E21.403 |
| 2013/0234153 | A1 | 9/2013 | Lidow et al. |
| 2014/0091363 | A1 | 4/2014 | Jeon et al. |
| 2014/0203288 | A1 | 7/2014 | Hsiung |
| 2015/0295073 | A1 | 10/2015 | Tomita et al. |
| 2017/0104091 | A1 | 4/2017 | Tanaka |
| 2017/0365680 | A1 | 12/2017 | Smith |

FOREIGN PATENT DOCUMENTS

| | | |
|---|---|---|
| CN | 104377241 A | 2/2015 |
| CN | 109148574 A | 1/2019 |
| CN | 109585545 A | 4/2019 |
| JP | 2008159681 | 7/2008 |
| JP | 2014072528 | 4/2014 |
| JP | 2015204304 | 11/2015 |
| JP | 2017073506 | 4/2017 |
| TW | 201044576 A | 12/2010 |
| TW | 201347177 A | 11/2013 |
| TW | 201905984 A | 2/2019 |

OTHER PUBLICATIONS

Office Action issued on Sep. 8, 2023, in corresponding Taiwanese patent Application No. 109112322, 39 pages.
International Preliminary Report on Patentability issued for International Patent Application No. PCT/JP2020/009797, Date of mailing: Oct. 28, 2021, 14 pages including English translation.
Office Action issued for Taiwanese patent application No. 109112322, dated Oct. 6, 2022, 47 pages including English machine translation.
International Search Report and Written Opinion issued for International Patent Application No. PCT/JP2020/009797, Date of mailing: May 26, 2020, 10 pages including English translation of Search Report.
Office Action issued on Dec. 26, 2023, in corresponding Taiwanese patent application No. 109112322, 5 pages.
Japanese Office Action issued Mar. 14, 2024 in corresponding Japanese Patent Application No. 2021-514818, 9 pages.
Taiwanese Decision of Refusal for Reexamination issued May 29, 2024 in corresponding Taiwanese Patent Application No. 109112322, 21 pages.

* cited by examiner

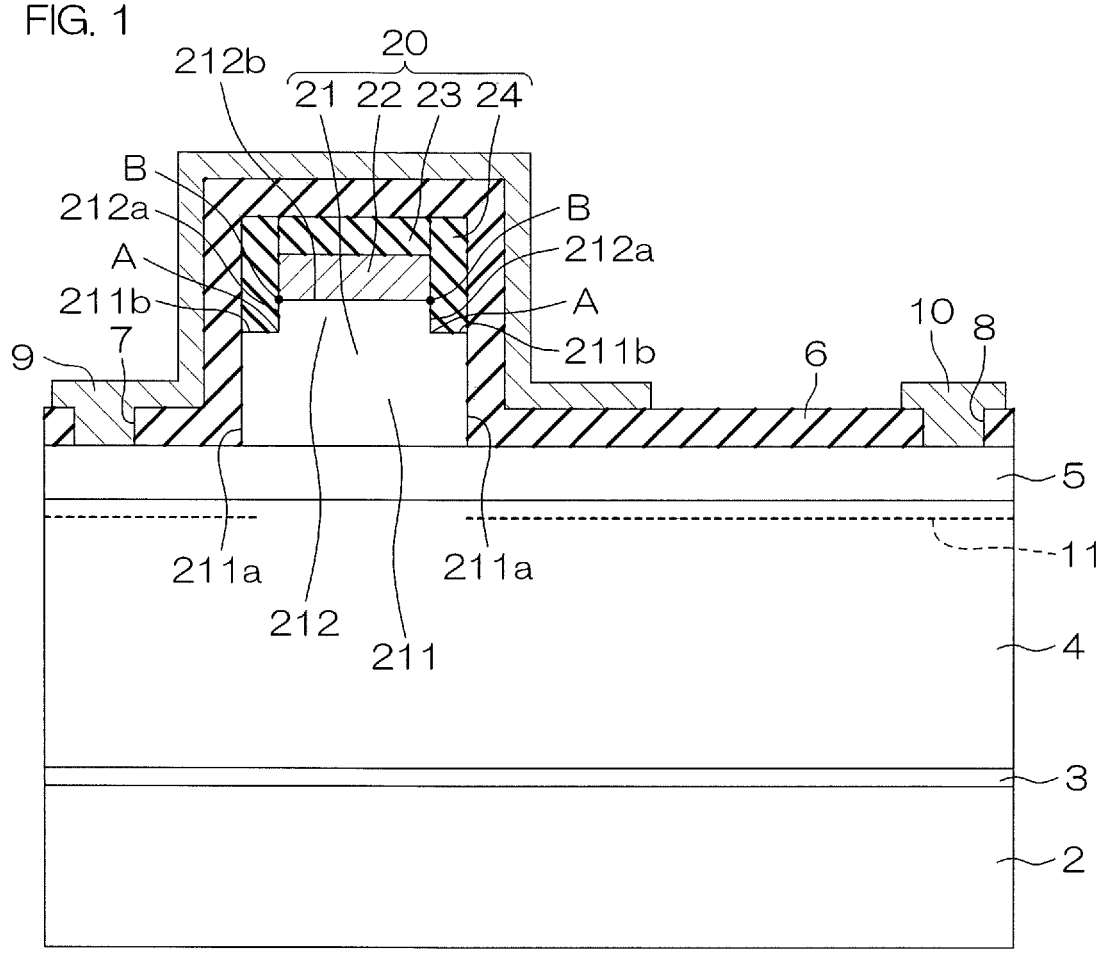

NITRIDE SEMICONDUCTOR DEVICE AND METHOD FOR MANUFACTURING SAME

TECHNICAL FIELD

The present invention relates to a nitride semiconductor device that is constituted of a group III nitride semiconductor (hereinafter referred to at times simply as "nitride semiconductor") and a method for manufacturing the same.

BACKGROUND ART

A group III nitride semiconductor is a semiconductor among group III-V semiconductors with which nitrogen is used as the group V element. Aluminum nitride (AlN), gallium nitride (GaN), and indium nitride (InN) are representative examples thereof. It can generally be expressed as $Al_xIn_yGa_{1-x-y}N$ ($0 \leq x \leq 1$, $0 \leq y \leq 1$, $0 \leq x+y \leq 1$).

An HEMT (high electron mobility transistor) using such a nitride semiconductor has been proposed. Such an HEMT includes, for example, an electron transit layer constituted of GaN and an electron supply layer constituted of an AlGaN epitaxially grown on the electron transit layer. A pair of source electrode and drain electrode are formed such as to contact the electron supply layer and a gate electrode is disposed therebetween.

Due to polarization caused by lattice mismatch of GaN and the AlGaN, a two-dimensional electron gas is formed at a position inside the electron transit layer that is only a few Å inward from an interface between the electron transit layer and the electron supply layer. A source and a drain are connected to each other with the two-dimensional electron gas as a channel. When the two-dimensional electron gas is interrupted by application of a control voltage to the gate electrode, the source and the drain are interrupted from each other. The source and the drain are made conductive to each other in a state where the control voltage is not applied to the gate electrode and therefore the device is of a normally-on type.

Devices using a nitride semiconductor have features of high withstand voltage, high temperature operation, high current density, high speed switching, and low on resistance and applications to power devices are thus being proposed, for example, in Patent Literature 1.

CITATION LIST

Patent Literature

Patent Literature 1: Japanese Patent Application Publication No. 2017-73506

SUMMARY OF INVENTION

Technical Problem

Patent Literature 1 discloses an arrangement where a p type GaN gate layer (nitride semiconductor gate layer) is laminated on an AlGaN electron supply layer, a gate electrode is disposed thereon, and a channel is eliminated by a depletion layer spreading from the p type GaN gate layer to achieve a normally-off operation.

With such an arrangement, there is a problem that a gate leak current is large because an electric field tends to concentrate at a contact portion of an upper surface of the p type GaN gate layer and a side edge of a lower surface of the gate electrode (width direction end of the lower surface of the gate electrode).

If the gate leak current is large, this leads to such problems as not being able to secure a gate voltage necessary for obtaining a desired on resistance or power consumption by a gate drive circuit increasing, and there is concern about decrease in efficiency and increase in heat generation in a power circuit and a control circuit portion. This is a large issue for an HEMT that features high frequency switching.

An object of the present invention is to provide a nitride semiconductor device and a method for manufacturing the same that enable reduction of a gate leak current and enable suppression of decrease in a rated gate voltage, which is the maximum value applicable to a gate with stability.

Solution to Problem

A preferred embodiment of the present invention provides a nitride semiconductor device that includes a first nitride semiconductor layer that constitutes an electron transit layer, a second nitride semiconductor layer that is formed on the first nitride semiconductor layer, is larger in bandgap than the first nitride semiconductor layer, and constitutes an electron supply layer, and a gate portion that is formed on the second nitride semiconductor layer, and where the gate portion includes a semiconductor gate layer of a ridge shape that is formed on the second nitride semiconductor layer and is constituted of a nitride semiconductor containing an acceptor type impurity and a gate electrode that is formed on the semiconductor gate layer, the semiconductor gate layer is constituted of a gate layer main body portion that is formed on the second nitride semiconductor layer and an upper protruding portion that is formed on a width intermediate portion of an upper surface of the gate layer main body portion, and the gate electrode is formed on a top surface of the upper protruding portion.

With the present arrangement, an electric field concentrates at a location at which the upper surface of the gate layer main body portion of the semiconductor gate layer and a side surface of the upper protruding portion intersect. That is, with the present arrangement, a position at which the electric field concentrates can be separated from a width direction end of a lower surface of the gate electrode. It is thereby made possible to suppress a gate leak current from the width direction end of the gate electrode. A nitride semiconductor device can thereby be realized that enables reduction of the gate leak current and enables suppression of decrease in a rated gate voltage, which is the maximum value applicable to a gate with stability.

In the preferred embodiment of the present invention, a first dielectric film that covers a side surface of the upper protruding portion and the upper surface of the gate layer main body portion connected to a lower edge of the side surface and a second dielectric film that covers a side surface of the gate layer main body portion and a upper surface of the second nitride semiconductor layer are further included.

In the preferred embodiment of the present invention, a source contact hole and a drain contact hole that penetrate through the second dielectric film in a thickness direction are formed in the second dielectric film and the nitride semiconductor device further includes a source electrode and a drain electrode that penetrate through the source contact hole and the drain contact hole respectively and are in ohmic contact with the second nitride semiconductor layer.

In the preferred embodiment of the present invention, a thickness of the upper protruding portion is thinner than a thickness of the gate layer main body portion.

In the preferred embodiment of the present invention, a thickness of the upper protruding portion is thicker than a thickness of the gate layer main body portion.

In the preferred embodiment of the present invention, both side surfaces of the gate layer main body portion are formed to inclined surfaces by which a width of the gate layer main body portion is made gradually narrower toward the gate electrode side and both side surfaces of the upper protruding portion are formed to inclined surfaces by which the width of the upper protruding portion is made gradually narrower toward the gate electrode side.

In the preferred embodiment of the present invention, an average inclination angle of the side surfaces of the gate layer main body portion differs from an average inclination angle of the side surfaces of the upper protruding portion.

In the preferred embodiment of the present invention, upper surfaces of both side portions of the gate layer main body portion that respectively connect lower edges of both side surfaces of the upper protruding portion and upper edges of the corresponding side surfaces of the gate layer main body portion are formed to inclined surfaces that thicken gradually toward a width center of the gate layer main body portion.

In the preferred embodiment of the present invention, the gate electrode is formed such as to cover the entire top surface of the upper protruding portion.

In the preferred embodiment of the present invention, in plan view, both side edges of a lower surface of the gate electrode are receded further inward than corresponding side edges of the top surface of the upper protruding portion.

In the preferred embodiment of the present invention, the first nitride semiconductor layer is constituted of a GaN layer, the second nitride semiconductor layer is constituted of an $Al_xGa_{1-x}N$ ($0<x\leq1$) layer, and the semiconductor gate layer is constituted of a p type GaN layer.

In the preferred embodiment of the present invention, if the semiconductor gate layer is deemed to be a first semiconductor gate layer, a second semiconductor gate layer that is constituted of a nitride semiconductor with a larger bandgap than the first semiconductor gate layer is interposed between the first semiconductor gate layer and the gate electrode.

In the preferred embodiment of the present invention, if the semiconductor gate layer is deemed to be a first semiconductor gate layer, a second semiconductor gate layer that is constituted of a nitride semiconductor is interposed between the first semiconductor gate layer and the gate electrode and the second semiconductor gate layer is constituted of an $Al_yGa_{1-y}N$ ($0\leq y<1$, $y\leq x$) layer.

In the preferred embodiment of the present invention, the gate electrode is constituted of a single film that is any one of a Ti film, a TiN film, and a TiW film or of a composite film constituted of any combination of two or more of the films.

In the preferred embodiment of the present invention, a third dielectric layer that is formed on an upper surface of the gate electrode is further included.

In the preferred embodiment of the present invention, a third dielectric layer that is formed on an upper surface of the gate electrode is further included and a thickness of the third dielectric layer is thicker than a thickness of the second dielectric layer.

In the preferred embodiment of the present invention, the first dielectric layer and the second dielectric layer are each constituted of a single film that is any one of an SiN film, an SiO$_2$ film, an SiON film, an Al$_2$O$_3$ film, an AlN film, and an AlON film or of a composite film constituted of any combination of two or more of the films.

In the preferred embodiment of the present invention, the first dielectric layer and the second dielectric layer are constituted of the same material.

In the preferred embodiment of the present invention, the first dielectric layer and the second dielectric layer are constituted of different materials.

A preferred embodiment of the present invention provides a method for manufacturing a nitride semiconductor device including a step of forming a first nitride semiconductor layer that constitutes an electron transit layer, a second nitride semiconductor layer that constitutes an electron supply layer, and a semiconductor gate material film that is constituted of a nitride semiconductor containing an acceptor type impurity in that order on a substrate, a step of forming a gate electrode film on the semiconductor gate material film, a step of selectively forming a top dielectric film on the gate electrode film, a step of performing dry etching using the top dielectric film as a mask to selectively remove the gate electrode film and the semiconductor gate material film down to a thickness intermediate portion of the semiconductor gate material film and thereby form a gate electrode that is constituted of the gate electrode film, a top wall that is constituted of the top dielectric film disposed on the gate electrode, and the semiconductor gate material film that has an upper protruding portion directly below the gate electrode, a step of forming a side dielectric film that covers exposed surfaces of the top wall, the gate electrode, and the semiconductor gate material film, a step of removing by etching portions of the side dielectric film other than portions covering respective side surfaces of the top wall, the gate electrode film, and the upper protruding portion to thereby form a side wall that is constituted of the side dielectric film and covers the side surfaces of the top wall, the gate electrode film, and the upper protruding portion, and a semiconductor gate layer forming step of performing dry etching using the top wall and the side wall as masks to selectively remove the semiconductor gate material film until a front surface of the second nitride semiconductor layer is exposed and thereby form a semiconductor gate layer that is constituted of a gate layer main body formed on the second nitride semiconductor layer and the upper protruding portion formed on a width intermediate portion of an upper surface of the gate layer main body portion.

By the present method for manufacturing, a nitride semiconductor device that enables reduction of the gate leak current and enables suppression of decrease in the rated gate voltage, which is the maximum value applicable to the gate with stability, can be manufactured.

In the preferred embodiment of the present invention, a step of forming, after the semiconductor gate layer forming step, a passivation film that covers exposed surfaces of the top wall, the side wall, and the second nitride semiconductor layer, a step of forming in the passivation film a source contact hole and a drain contact hole that penetrate through the passivation film in a thickness direction, and a step of forming a source electrode and a drain electrode that respectively penetrate through the source contact hole and the drain contact hole and are in ohmic contact with the second nitride semiconductor layer are further included.

The aforementioned as well as yet other objects, features, and effects of the present invention will be made clear by the following description of the preferred embodiments made with reference to the accompanying drawings.

BRIEF DESCRIPTION OF DRAWINGS

FIG. 1 is a sectional view for describing the arrangement of a nitride semiconductor device according to a first preferred embodiment of the present invention.

DESCRIPTION OF EMBODIMENTS

Figure 2A:
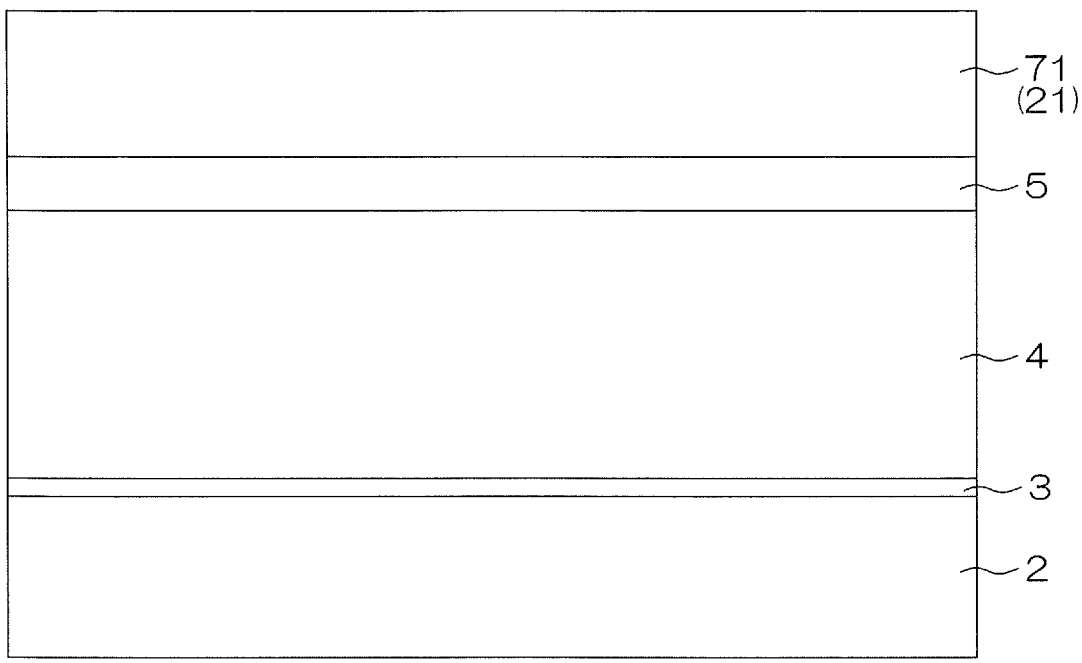
FIG. 2A is a sectional view of an example of a manufacturing process of the nitride semiconductor device shown in FIG. 1.

FIG. 1 is a sectional view for describing the arrangement of a nitride semiconductor device according to a first preferred embodiment of the present invention.

The nitride semiconductor device 1 includes a substrate 2, a buffer layer 3 that is formed on a front surface of the substrate 2, a first nitride semiconductor layer 4 that is epitaxially grown on the buffer layer 3, a second nitride semiconductor layer 5 that is epitaxially grown on the first nitride semiconductor layer 4, and a gate portion 20 formed on the second nitride semiconductor layer 5.

Further, the nitride semiconductor device 1 includes a passivation film (second dielectric film) 6 that covers the second nitride semiconductor layer 5 and the gate portion 20. Further, the nitride semiconductor device 1 includes a source electrode 9 and a drain electrode 10 that penetrate through a source contact hole 7 and a drain contact hole 8 formed in the passivation film 6 and are in ohmic contact with the second nitride semiconductor layer 5. The source electrode 9 and the drain electrode 10 are disposed at an interval. The source electrode 9 is formed such as to cover the gate portion 20.

The substrate 2 may, for example, be a silicon substrate of low resistance. The silicon substrate of low resistance may be a p type substrate having an electric resistivity of, for example, 0.001 Ωmm to 0.5 Ωmm (more specifically, approximately 0.01 Ωmm to 0.1 Ωmm). Also, besides a silicon substrate of low resistance, the substrate 2 may instead be an SiC substrate of low resistance, a GaN substrate of low resistance, etc. The substrate 2 has a thickness, for example, of approximately 650 μm during a semiconductor process and is ground to not more than approximately 300 μm in a preliminary stage before being made into a chip. The substrate 2 is electrically connected to the source electrode 9.

In this preferred embodiment, the buffer layer 3 is constituted of a multilayer buffer layer in which a plurality of nitride semiconductor films are laminated. In this preferred embodiment, the buffer layer 3 is constituted of a first buffer layer (not shown) constituted of an AlN film in contact with the front surface of the substrate 2 and a second buffer layer (not shown) constituted of an AlN/AlGaN superlattice layer laminated on a front surface of the first buffer layer (the front surface at an opposite side to the substrate 2 side). A film thickness of the first buffer layer is approximately 100 nm to 500 nm. A film thickness of the second buffer layer is approximately 500 nm to 2 μm. The buffer layer 3 may instead be constituted, for example, of a single film or a composite film of AlGaN.

The first nitride semiconductor layer 4 constitutes an electron transit layer. In this preferred embodiment, the first nitride semiconductor layer 4 is constituted of a GaN layer and a thickness thereof is approximately 0.5 μm to 2 μm. Also, an impurity for making a region other than a front surface region semi-insulating may be introduced for a purpose of suppressing a leak current that flows through the first nitride semiconductor layer 4. In this case, a concentration of the impurity is preferably not less than $4 \times 10^{16}$ cm$^{-3}$. Also, the impurity is, for example, C or Fe.

The second nitride semiconductor layer 5 constitutes an electron supply layer. The second nitride semiconductor layer 5 is constituted of a nitride semiconductor with a larger bandgap than the first nitride semiconductor layer 4. Specifically, the second nitride semiconductor layer 5 is constituted of a nitride semiconductor with a higher Al composition than the first nitride semiconductor layer 4. In a nitride semiconductor, the higher the Al composition, the larger the bandgap. In this preferred embodiment, the second nitride semiconductor layer 5 is constituted of an Al$_x$Ga$_{1-x}$N layer (0<x≤1) and a thickness thereof is approximately 5 nm to 15 nm.

The first nitride semiconductor layer (electron transit layer) 4 and the second nitride semiconductor layer (electron supply layer) 5 are thus constituted of nitride semiconductors that differ in bandgap (Al composition) and a lattice mismatch occurs therebetween. Also, due to spontaneous polarizations of the first nitride semiconductor layer 4 and the second nitride semiconductor layer 5 and a piezo polarization due to the lattice mismatch between the two, an energy level of a conduction band of the first nitride semiconductor layer 4 at an interface between the first nitride semiconductor layer 4 and the second nitride semiconductor layer 5 is made lower than a Fermi level. Thereby, inside the first nitride semiconductor layer 4, a two-dimensional electron gas (2 DEG) 11 spreads at a position close to the interface between the first nitride semiconductor layer 4 and the second nitride semiconductor layer 5 (for example, at a distance of approximately several Å from the interface).

The gate portion 20 includes a semiconductor gate layer 21 of a ridge shape that is epitaxially grown on the second nitride semiconductor layer 5 and a gate electrode 22 that is formed on the semiconductor gate layer 21. The gate portion 20 is disposed biasedly toward the source contact hole 7.

In this preferred embodiment, the semiconductor gate layer 21 is constituted of a gate layer main body portion 211 with a lateral cross section being substantially rectangular and an upper protruding portion 212 that is formed on a width intermediate portion of an upper surface of the gate layer main body portion 211 and with a lateral cross section being substantially rectangular. A step is formed between a top surface (upper surface) 212b of the upper protruding portion 212 and an upper surface 211b at one side of the gate layer main body portion 211 and a step is formed between the top surface 212b of the upper protruding portion 212 and an upper surface 211b at another side of the gate layer main body portion 211.

The upper surface 211b at a side portion at the one side of the gate layer main body portion 211 connects a lower edge of a side surface 212a at the one side of the upper protruding portion 212 and an upper edge of a side surface 211a at one side of the gate layer main body portion 211. The upper surface 211b at a side portion at the other side of the gate layer main body portion 211 connects a lower edge of a side surface 212a at another side of the upper protruding portion 212 and an upper edge of a side surface 211a at the other side of the gate layer main body portion 211.

The gate electrode 22 is formed on the top surface of the upper protruding portion 212. In this preferred embodiment, the gate electrode 22 is formed such as to cover the entire top surface 212b of the upper protruding portion 212.

The semiconductor gate layer 21 is constituted of a nitride semiconductor doped with an acceptor type impurity. In this preferred embodiment, the semiconductor gate layer 21 is constituted of a GaN layer (p type GaN layer) doped with the acceptor type impurity. For a threshold voltage to be of an appropriate magnitude, a film thickness of the semiconductor gate layer 21 is preferably not less than 50 nm and more preferably not less than 70 nm.

In this preferred embodiment, a thickness of the upper protruding portion 212 is thinner than a thickness of the gate layer main body portion 211. The thickness of the gate layer main body portion 211 is approximately 40 nm to 60 nm and the thickness of the upper protruding portion 212 is approximately 10 nm to 40 nm.

A concentration of the acceptor type impurity implanted in the semiconductor gate layer 21 is preferably not less than $1\times10^{19}$ cm$^{-3}$. In this preferred embodiment, the acceptor type impurity is Mg (magnesium). The acceptor type impurity may instead be Zn (zinc) or other acceptor type impurity besides Mg. The semiconductor gate layer 21 is provided to cancel out the two-dimensional electron gas 11 formed near the interface between the first nitride semiconductor layer 4 (electron transit layer) and the second nitride semiconductor layer 5 (electron supply layer) in a region directly below the gate portion 20.

The gate electrode 22 is in Schottky junction with the upper protruding portion 212 of the semiconductor gate layer 21. The gate electrode 22 is constituted of TiN. A film thickness of the gate electrode 22 is approximately 50 nm to 150 nm. The gate electrode 22 may be constituted of a single film that is any one of a Ti film, a TiN film, and a TiW film or of a composite film constituted of any combination of two or more of the films.

The gate portion 20 further includes a top wall (third dielectric film) 23 that covers an upper surface of the gate electrode 22 and side walls (first dielectric films) 24 that respectively cover both side surfaces of the top wall 23 and both side surfaces 212a of the upper protruding portion 212. Each side wall 24 also covers the upper surface 211b of the corresponding side portion of the gate layer main body portion 211. In this preferred embodiment, the top wall 23 and the side walls 24 are constituted of SiN films.

The passivation film 6 covers a front surface of the second nitride semiconductor layer 5 (with the exception of regions facing the contact holes 7 and 8) and side surfaces and a front surface of the gate portion 20. In this preferred embodiment, the passivation film 6 is constituted of an SiN film.

A film thickness of the top wall 23 is approximately 50 nm to 200 nm. A film thickness of the side walls 24 is approximately 110 nm to 390 nm. A film thickness of the passivation film 6 is approximately 50 nm to 200 nm. To suppress a gate leak current from the gate electrode 22 upper surface, the film thickness of the top wall 23 is preferably thicker than the film thickness of the passivation film 6.

The top wall 23, the side walls 24, and the passivation film 6 may each be constituted of a single film that is any one of an SiN film, an SiO$_2$ film, an SiON film, an Al$_2$O$_3$ film, an AlN film, and an AlON film or of a composite film constituted of any combination of two or more of the films. The side walls 24 and the passivation film 6 may be constituted of the same material or may be constituted of different materials.

The source electrode 9 and the drain electrode 10 are constituted, for example, of first metal layers (ohmic metal layers) that are in ohmic contact with the second nitride semiconductor layer 5, second metal layers (main electrode metal layers) that are laminated on the first metal layers, third metal layers (adhesion layers) that are laminated on the second metal layers, and fourth metal layers (barrier metal layers) that are laminated on the third metal layers. The first metal layers are, for example, Ti layers with thicknesses of approximately 10 nm to 20 nm. The second metal layers are, for example, Al layers with thicknesses of approximately 100 nm to 300 nm.

The third metal layers are, for example, Ti layers with thicknesses of approximately 10 nm to 20 nm. The fourth metal layers are, for example, TiN layers with thicknesses of approximately 10 nm to 50 nm.

In the nitride semiconductor device 1, a heterojunction is formed by there being formed on the first nitride semiconductor layer 4 (electron transit layer), the second nitride semiconductor layer 5 (electron supply layer) that differs in bandgap (Al composition). The two-dimensional electron gas 11 is thereby formed inside the first nitride semiconductor layer 4 near the interface between the first nitride semiconductor layer 4 and the second nitride semiconductor layer 5, and an HEMT making use of the two-dimensional electron gas 11 as a channel is formed. The gate electrode 22 faces the second nitride semiconductor layer 5 across the semiconductor gate layer 21.

Below the gate electrode 22, energy levels of the first nitride semiconductor layer 4 and the second nitride semiconductor layer 5 are pulled up by the ionized acceptors contained in the semiconductor gate layer 21 that is constituted of the p type GaN layer. The energy level of the conduction band at the heterojunction interface between the first nitride semiconductor layer 4 and the second nitride semiconductor layer 5 is thus made higher than the Fermi level. Therefore, the two-dimensional electron gas 11 formed by the spontaneous polarizations of the first nitride semiconductor layer 4 and the second nitride semiconductor layer 5 and the piezo polarization due to the lattice mismatch of the two layers is not formed directly below the gate electrode 22 (gate portion 20).

Therefore, when a bias is not applied to the gate electrode 22 (zero bias state), the channel due to the two-dimensional electron gas 11 is interrupted directly below the gate electrode 22. A normally-off type HEMT is thus realized. When an appropriate on voltage (for example, of 5 V) is applied to the gate electrode 22, a channel is induced inside the first nitride semiconductor layer 4 directly below the gate electrode 22 and the two-dimensional electron gas 11 at both sides of the gate electrode 22 becomes connected. The source and the drain are thereby made continuous to each other.

For use, for example, a predetermined voltage (for example, of 10 V to 500 V) with which the drain electrode 10 side becomes positive is applied between the source electrode 9 and the drain electrode 10. In this state, an off voltage (0 V) or the on voltage (5 V) is applied to the gate electrode 22 with the source electrode 9 being at a reference potential (0 V).

FIG. 2A to FIG. 2H are sectional views for describing an example of a manufacturing process of the nitride semiconductor device 1 described above and show a cross-sectional structure at a plurality of stages in the manufacturing process.

First, as shown in FIG. 2A, the buffer layer 3, the first nitride semiconductor layer (electron transit layer) 4, and the second nitride semiconductor layer (electron supply layer) 5 are epitaxially grown on the substrate 2 by an MOCVD (metal organic chemical vapor deposition) method. Further, a semiconductor gate material film 71 that is a material film of the semiconductor gate layer 21 is epitaxially grown on the second nitride semiconductor layer 5 by the MOCVD method.

Figure 2B:
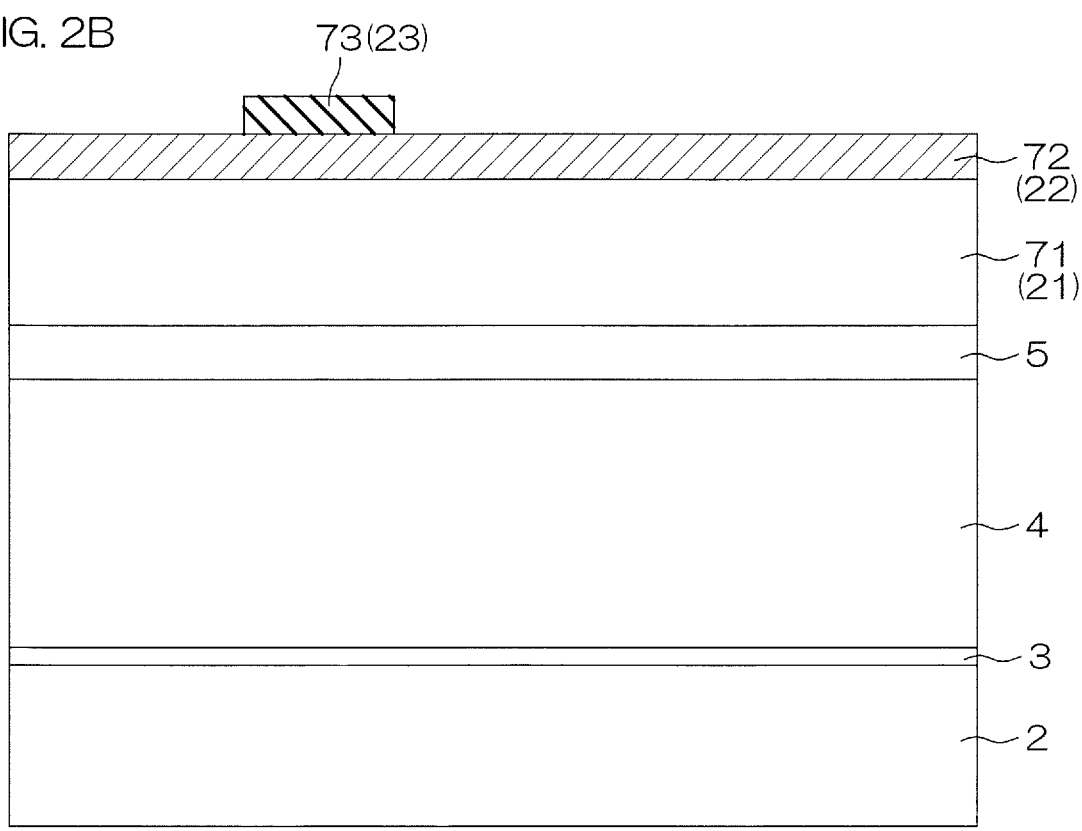
FIG. 2B is a sectional view of a step subsequent to that of FIG. 2A.

Next, as shown in FIG. 2B, a gate electrode film 72 that is a material film of the gate electrode 22 is formed by a sputtering method such as to cover an entire front surface that is exposed. A third dielectric film 73 that is a material of the top wall 23 is then formed on the gate electrode film 72 such as to cover a gate electrode formation planned region. The third dielectric film 73 is constituted, for example, of SiN.

Figure 2C:
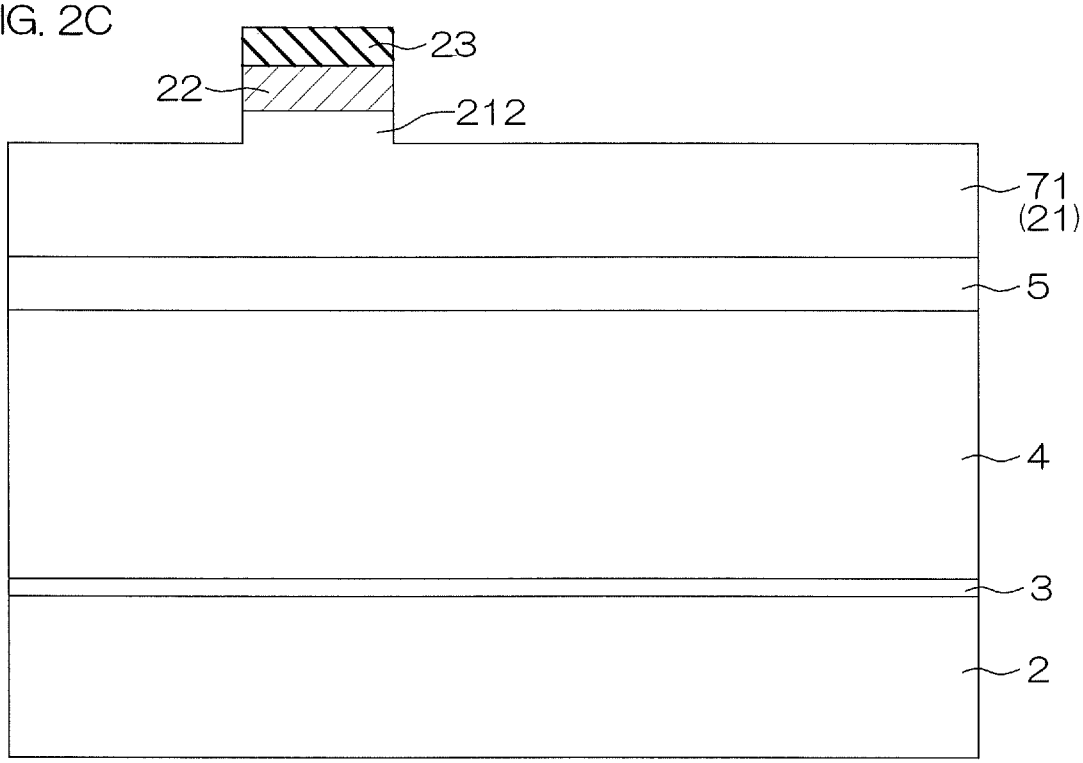
FIG. 2C is a sectional view of a step subsequent to that of FIG. 2B.

Next, as shown in FIG. 2C, by dry etching using the third dielectric film 73 as a mask, the gate electrode film 72 and the semiconductor gate material film 71 are selectively removed down to a thickness intermediate portion of the semiconductor gate material film 71. Thereby, the gate electrode 22 constituted of the gate electrode film 72, the top wall 23 constituted of the third dielectric film 73 disposed on the gate electrode 22, and the semiconductor gate material film 71 having the upper protruding portion 212 directly below the gate electrode 22 are formed.

Figure 2D:
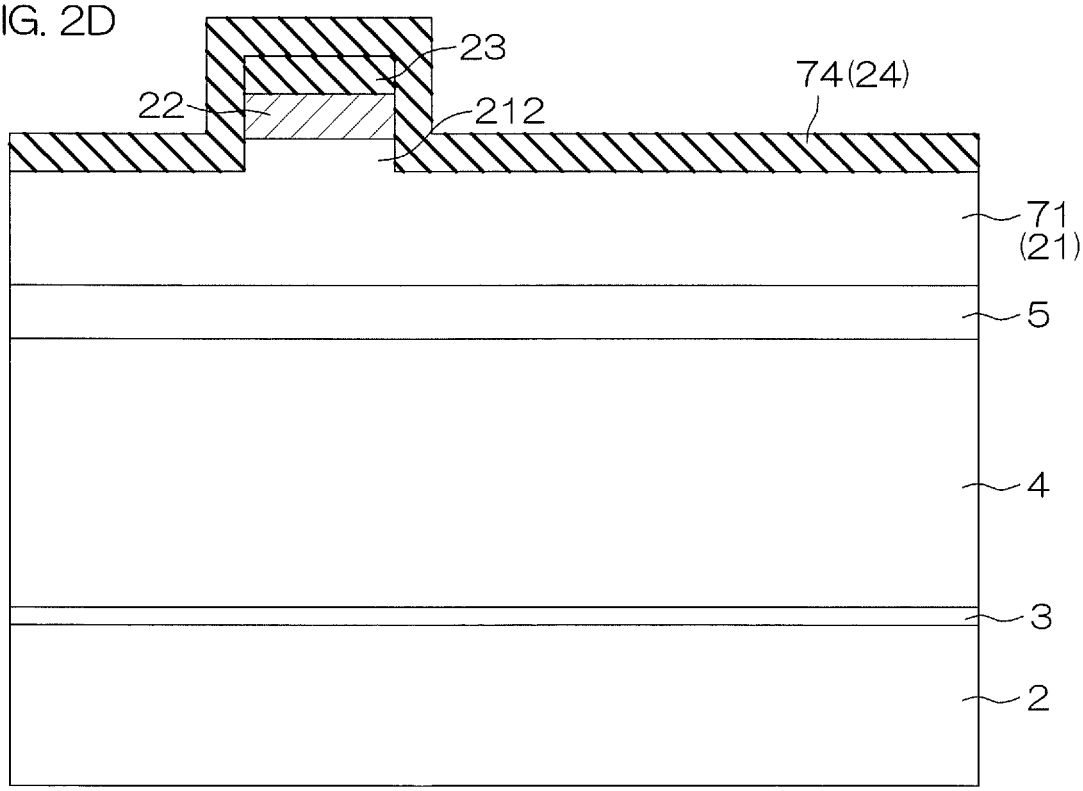
FIG. 2D is a sectional view of a step subsequent to that of FIG. 2C.

Next, as shown in FIG. 2D, a first dielectric film 74 that is a material of the side walls 24 is formed such as to cover the top wall 23, the gate electrode 22, and the semiconductor gate material film 71. The first dielectric film 74 is constituted, for example, of SiN.

Figure 2E:
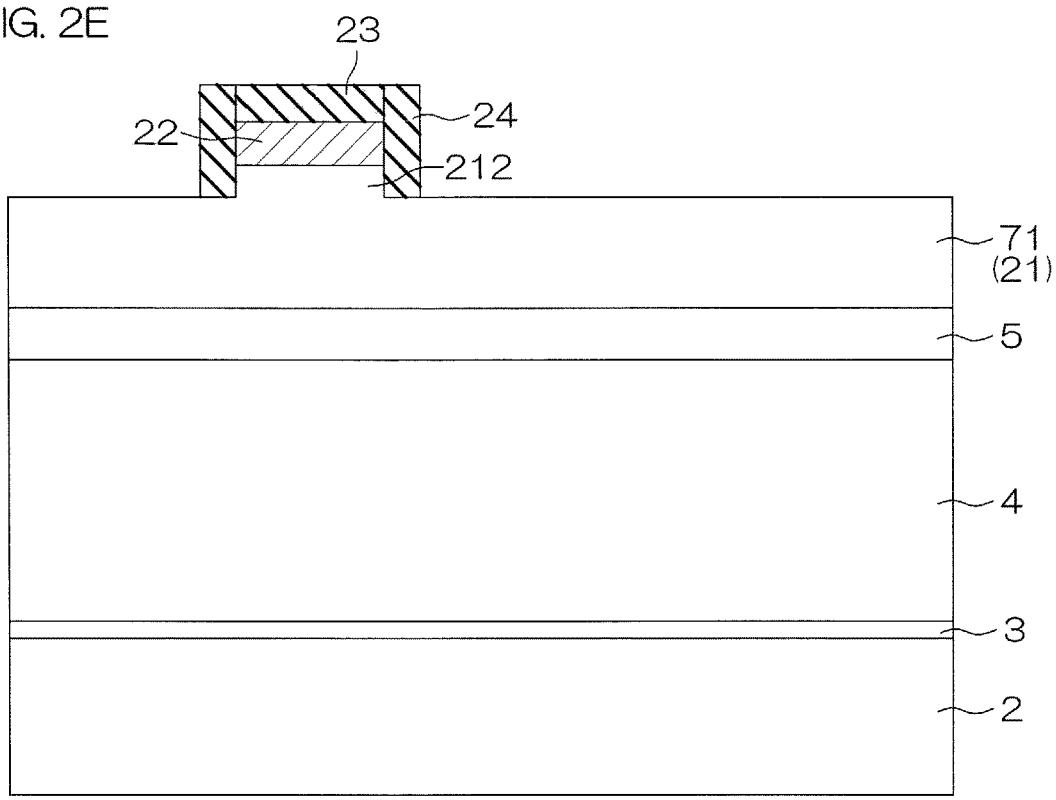
FIG. 2E is a sectional view of a step subsequent to that of FIG. 2D.

Next, as shown in FIG. 2E, portions of the first dielectric film 74 other than portions covering the respective side surfaces of the top wall 23, the gate electrode 22, and the upwardly protruding portion 212 are removed by anisotropic dry etching. The side walls 24 that are constituted of the first dielectric film 74 and cover the respective side surfaces of the top wall 23, the gate electrode 22, and the upwardly protruding portion 212 are thereby formed.

Figure 2F:
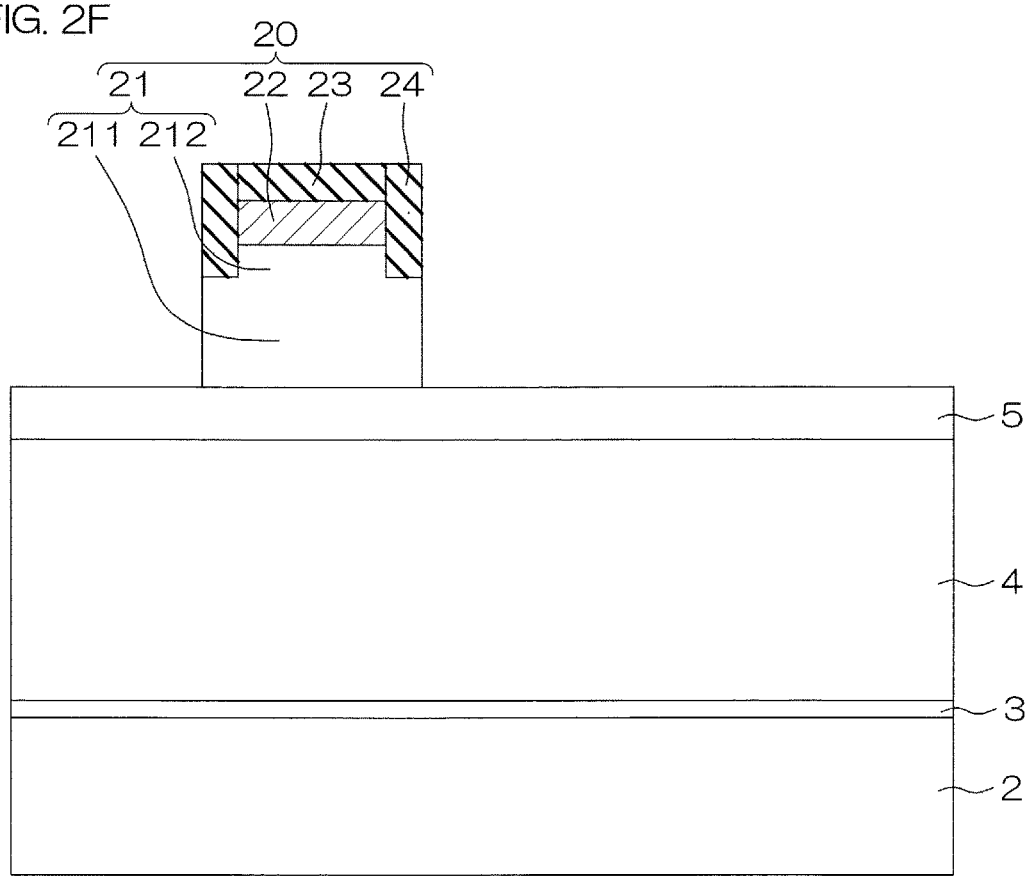
FIG. 2F is a sectional view of a step subsequent to that of FIG. 2E.

Next, as shown in FIG. 2F, by dry etching using the top wall 23 and the side walls 24 as masks, the semiconductor gate material film 71 is selectively removed until the front surface of the second nitride semiconductor layer 5 is exposed. The semiconductor gate layer 21 that is constituted of the gate layer main body portion 211 formed on the second nitride semiconductor layer 5 and the upper protruding portion 212 formed on the width intermediate portion of the gate layer main body upper surface is thereby formed. The gate portion 20 that is constituted of the semiconductor gate layer 21, the gate electrode 22, the top wall 23, and the side walls 24 is thereby formed.

Figure 2G:
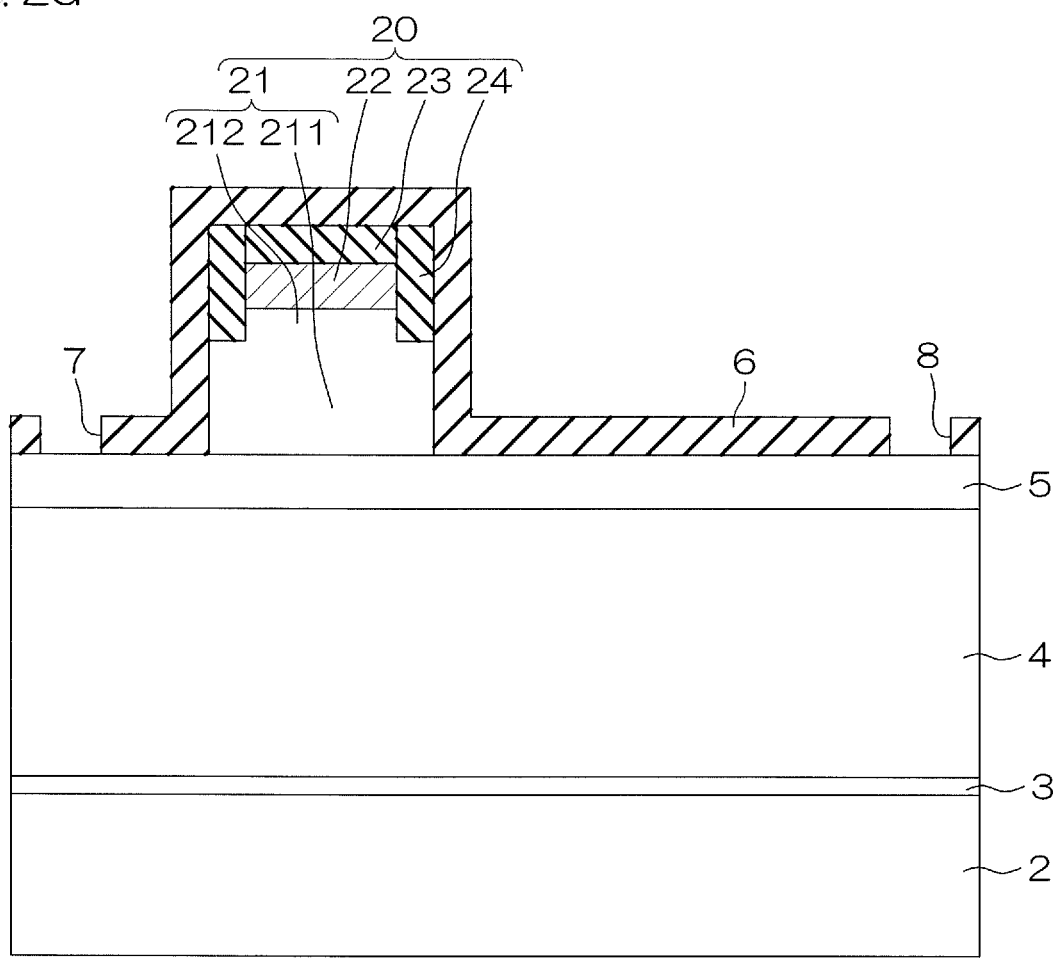
FIG. 2G is a sectional view of a step subsequent to that of FIG. 2F.

Next, as shown in FIG. 2G, the passivation film 6 is formed such as to cover entire surfaces that are exposed. The passivation film 6 is constituted, for example, of SiN. The source contact hole 7 and the drain contact hole 8 that reach to the second nitride semiconductor layer 5 are then formed in the passivation film 6.

Figure 2H:
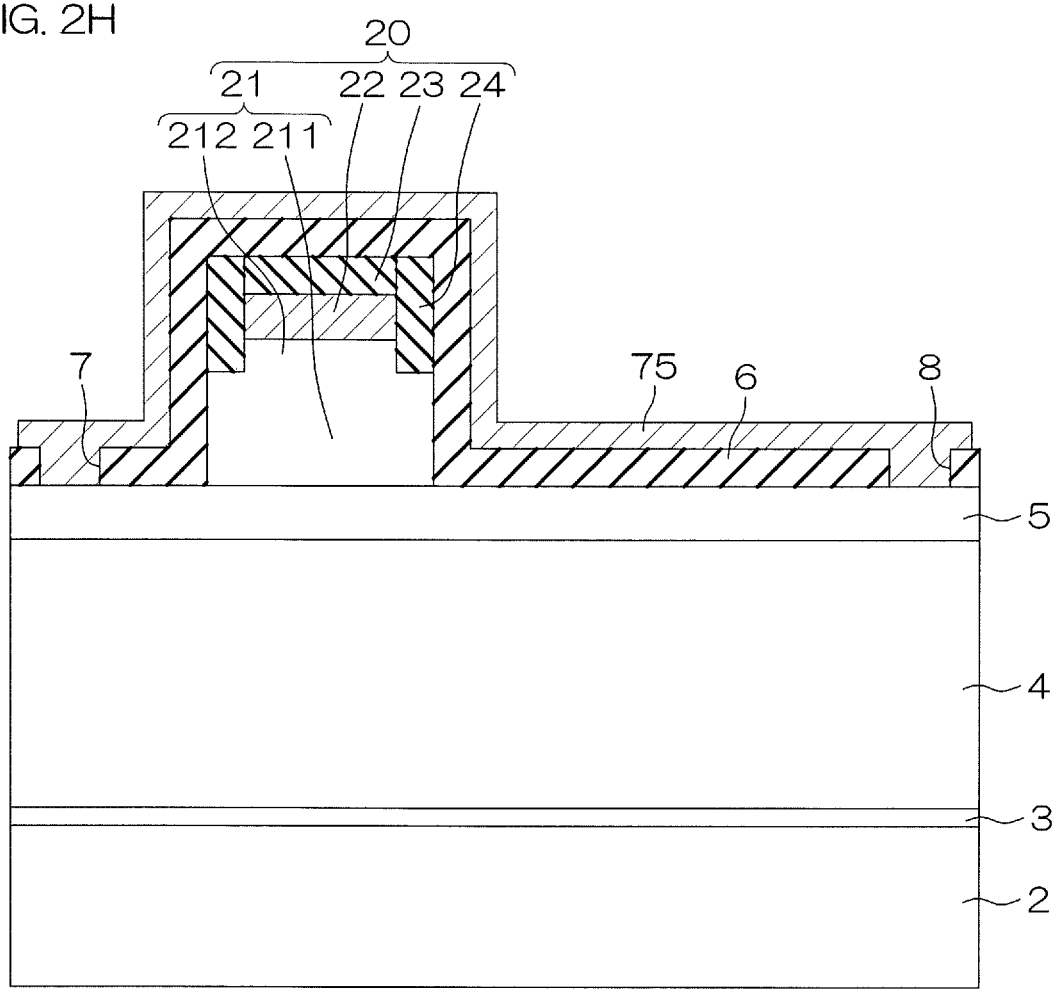
FIG. 2H is a sectional view of a step subsequent to that of FIG. 2G.

Next, as shown in FIG. 2H, a source/drain electrode film 75 is formed such as to cover entire surfaces that are exposed.

Lastly, the source/drain electrode film 75 is patterned by photolithography and etching to form the source electrode 9 and the drain electrode 10 that are in ohmic contact with the second nitride semiconductor layer 5. The nitride semiconductor device 1 with the structure such as shown in FIG. 1 is thereby obtained.

Figure 3:
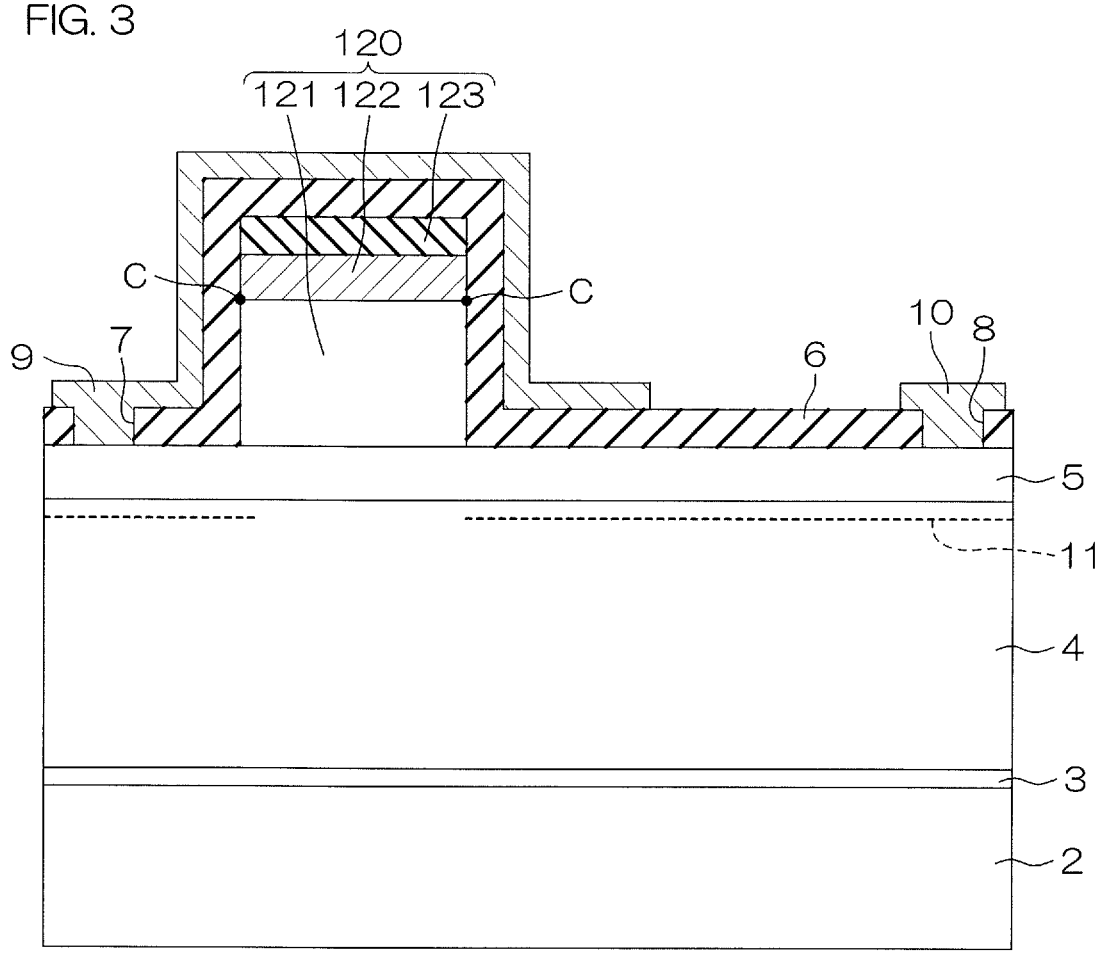
FIG. 3 is a sectional view of a nitride semiconductor device according to a comparative example.

FIG. 3 is a sectional view of a nitride semiconductor device 101 according to a comparative example.

In FIG. 3, portions corresponding to respective portions of FIG. 1 described above are indicated with the same reference signs attached as in FIG. 1. In comparison to the nitride semiconductor device 1 according to the first preferred embodiment, the nitride semiconductor device 101 according to the comparative example differs in the shape of the semiconductor gate layer 21. A lateral cross-sectional shape of the semiconductor gate layer 21 of the comparative example is a rectangle with a width that is the same as a width of the gate layer main body portion 211 of FIG. 1 and a thickness that is the same as the thickness of the semiconductor gate layer 21 of FIG. 1. Also, the gate electrode 22 is formed on an entire upper surface of the semiconductor gate layer 21. Although a top wall that covers the upper surface of the gate electrode 22 is formed in this comparative example as well, the side walls 24 are not formed.

With the nitride semiconductor device 101 according to the comparative example, an electric field tends to concentrate at contact portions C of the upper surface of the semiconductor gate layer 21 and side edges of a lower surface of the gate electrode 22 and therefore, a gate leak current from width direction ends C of the gate electrode 22 becomes large.

On the other hand, with the nitride semiconductor device 1 according to the first preferred embodiment, an electric field concentrates at locations A (see FIG. 1) at which the upper surfaces 211b of the gate layer main body portion 211 of the semiconductor gate layer 21 and the side surfaces 212a of the upper protruding portion 212 intersect.

That is, with the nitride semiconductor device 1 according to the first preferred embodiment, positions at which the electric field concentrates can be separated from width direction ends B of the lower surface of the gate electrode 22. It is thereby made possible to suppress a gate leak current from the width direction ends B of the gate electrode 22. A nitride semiconductor device can thereby be realized that enables reduction of the gate leak current and enables suppression of decrease in a rated gate voltage, which is the maximum value applicable to a gate with stability.

Also, inside the semiconductor gate layer 21, the electric field readily becomes uniform across an entirety in lateral directions because the thickness of the upper protruding portion 212 of the semiconductor gate layer 21 is thinner than the thickness of the gate layer main body portion 211 of the semiconductor gate layer 21. The density of the two-dimensional electron gas 11 directly below the gate portion 20 thus also becomes uniform readily and therefore, increase in on resistance can be suppressed.

Also, the gate electrode 22 is formed such as to cover the entire top surface 212b of the upper protruding portion 212 and therefore, the electric field in the vicinity of a boundary portion between the gate electrode 22 and the upper protruding portion 212 becomes substantially uniform across the entirety in lateral directions. A region in which a Schottky barrier is lowered is not present at both side portions of the gate electrode 22, therefore enabling reduction of the gate leak current and enabling suppression of decrease in the rated gate voltage, which is the maximum value applicable to the gate with stability.

FIG. 4 to FIG. 10 are sectional views for describing the arrangements of nitride semiconductor devices 1A to 1F according to second to eighth preferred embodiments of the present invention. In FIG. 4 to FIG. 10, portions corresponding to respective portions of FIG. 1 described above are indicated with the same reference signs attached as in FIG. 1.

Figure 4:
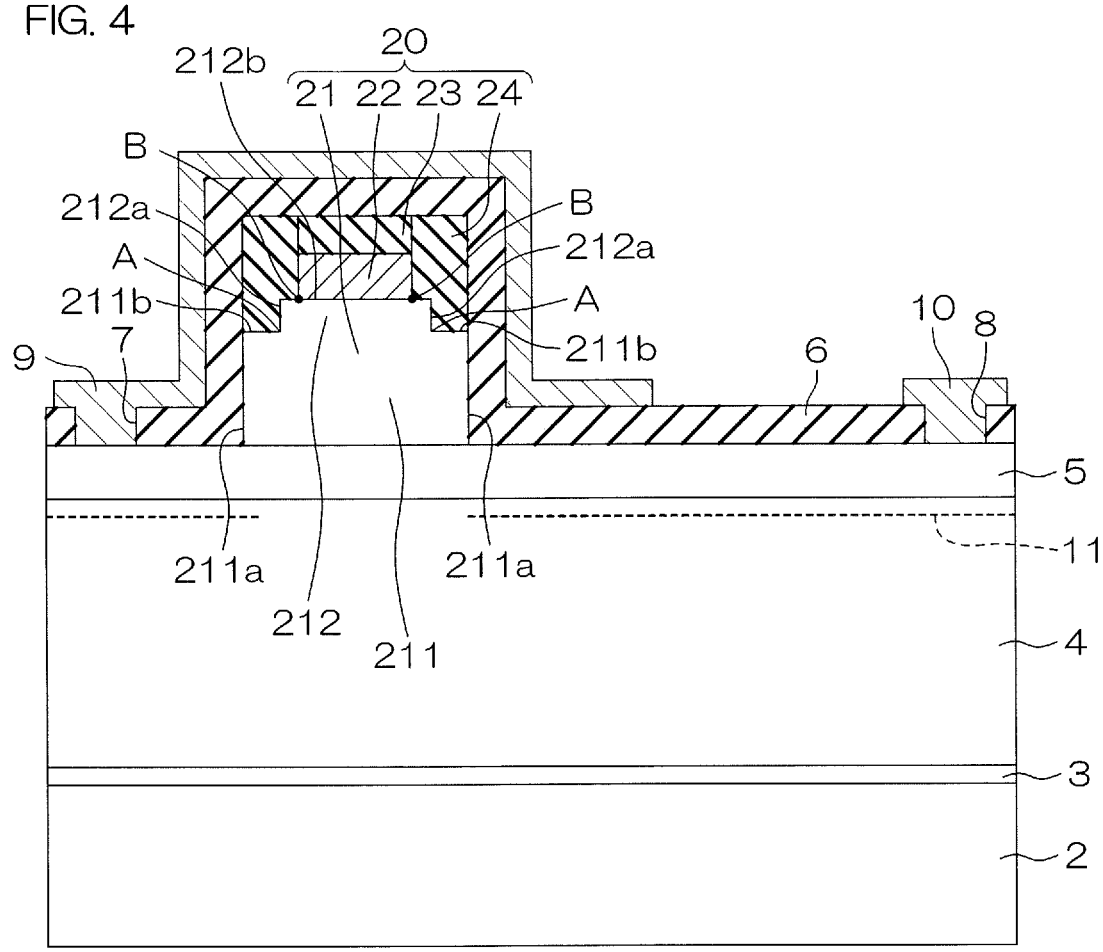
FIG. 4 is a sectional view for describing the arrangement of a nitride semiconductor device according to a second preferred embodiment of the present invention.

Referring to FIG. 4, with the nitride semiconductor device 1A according to the second preferred embodiment, a width of the gate electrode 22 is narrower than a width of the upper protruding portion 212 of the semiconductor gate layer 21. The gate electrode 22 is formed on a width intermediate portion of the top surface 212b of the upper protruding portion 212. Therefore, in plan view, both side edges of the lower surface of the gate electrode 22 are receded further inward than corresponding side edges of the top surface 212b of the upper protruding portion 212.

With the nitride semiconductor device 1A according to the second preferred embodiment, resistances from both side edges of the gate electrode 22 to side surfaces of the semiconductor gate layer 21 are increased and therefore, a gate leak current of a path passing near a side wall of the semiconductor gate layer 21 can be reduced.

Figure 5:
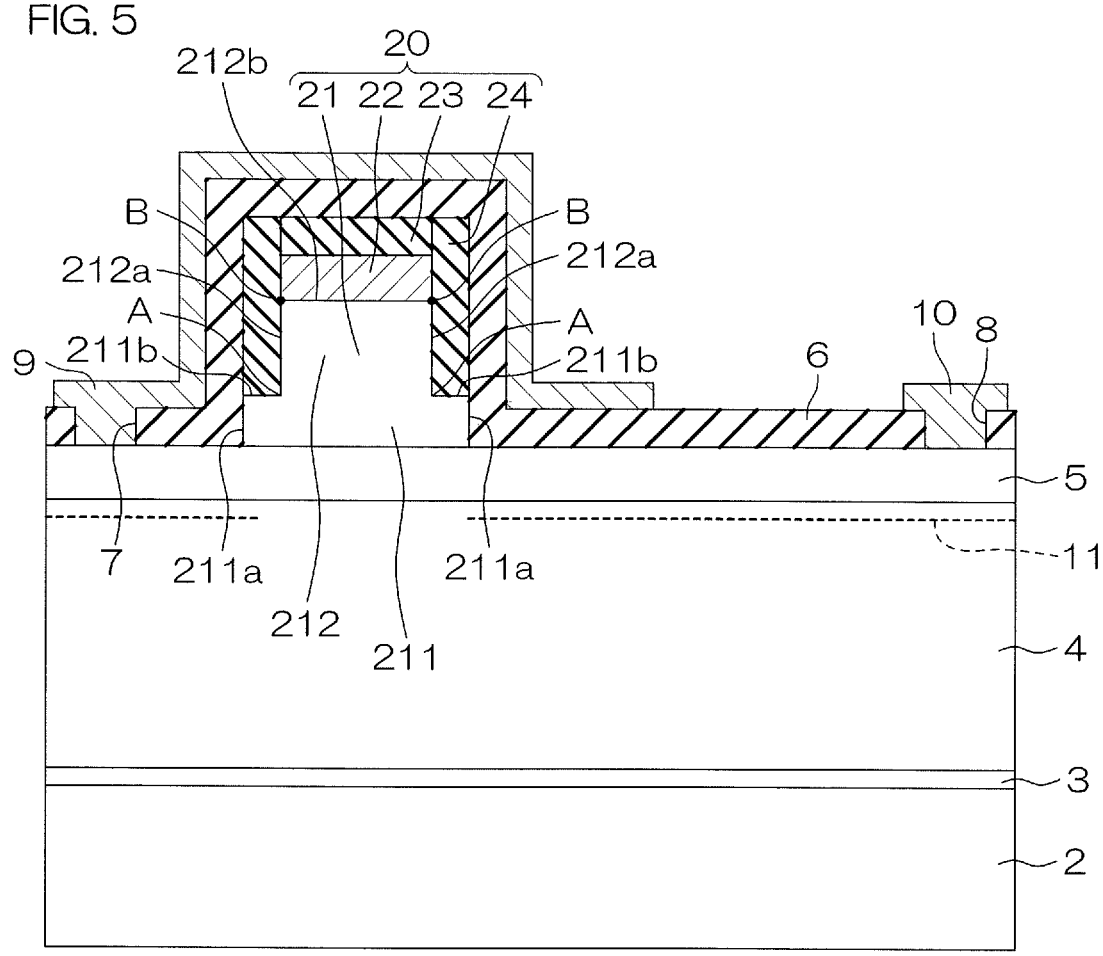
FIG. 5 is a sectional view for describing the arrangement of a nitride semiconductor device according to a third preferred embodiment of the present invention.

Referring to FIG. 5, with the nitride semiconductor device 1B according to the third preferred embodiment, the thickness of the upper protruding portion 212 of the semiconductor gate layer 21 is thicker than the thickness of the gate layer main body portion 211 of the semiconductor gate layer 21. In this case, thickness of the gate layer main body portion 211 is approximately 20 nm to 40 nm and the thickness of the upper protruding portion 212 is approximately 30 nm to 60 nm.

With the nitride semiconductor device 1B according to the third preferred embodiment, the locations A at which the electric field concentrates can be situated further away from the width direction ends B of the lower surface of the gate electrode 22 in comparison to the nitride semiconductor device 1 according to the first preferred embodiment and therefore, increase in a gate leak current at a junction portion of the upper protruding portion 212 and the gate electrode 22 can be suppressed.

Figure 6:
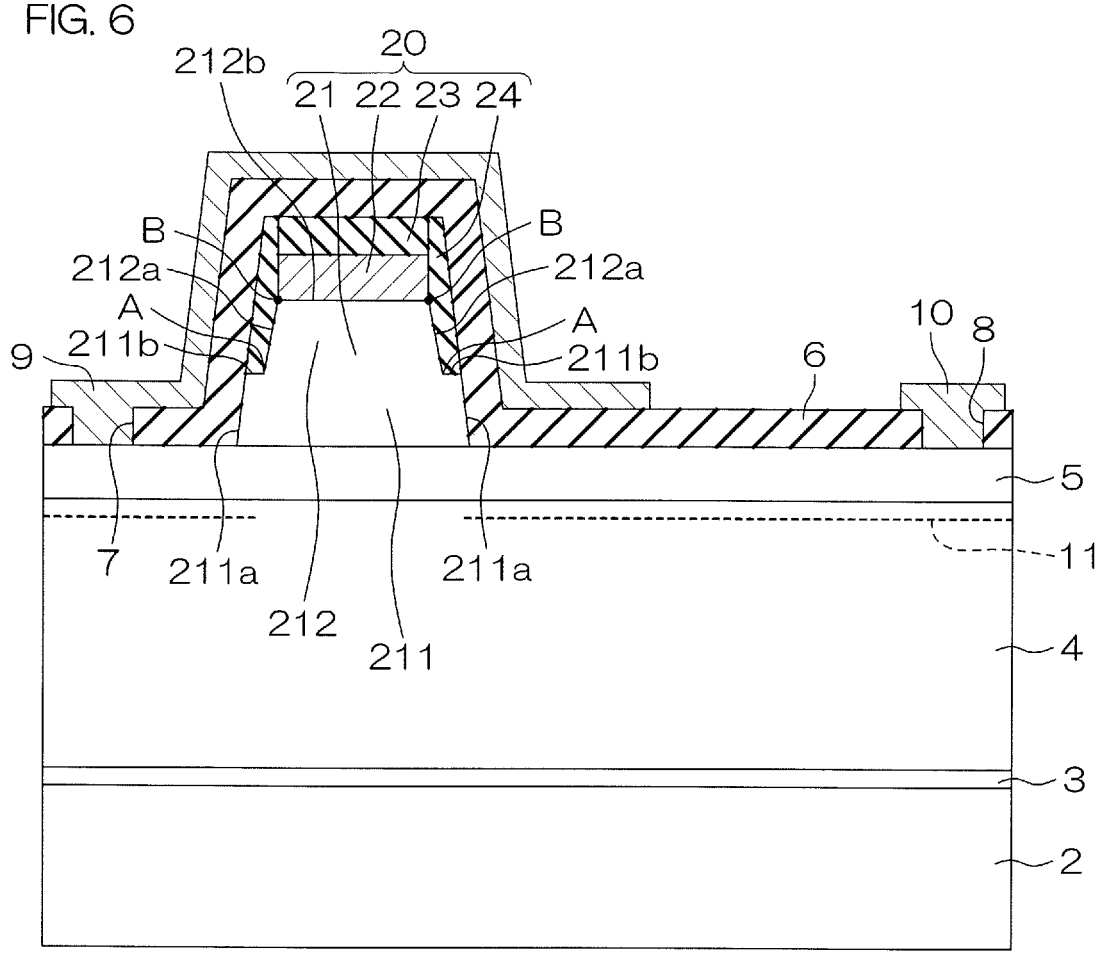
FIG. 6 is a sectional view for describing the arrangement of a nitride semiconductor device according to a fourth preferred embodiment of the present invention.
Figure 7:
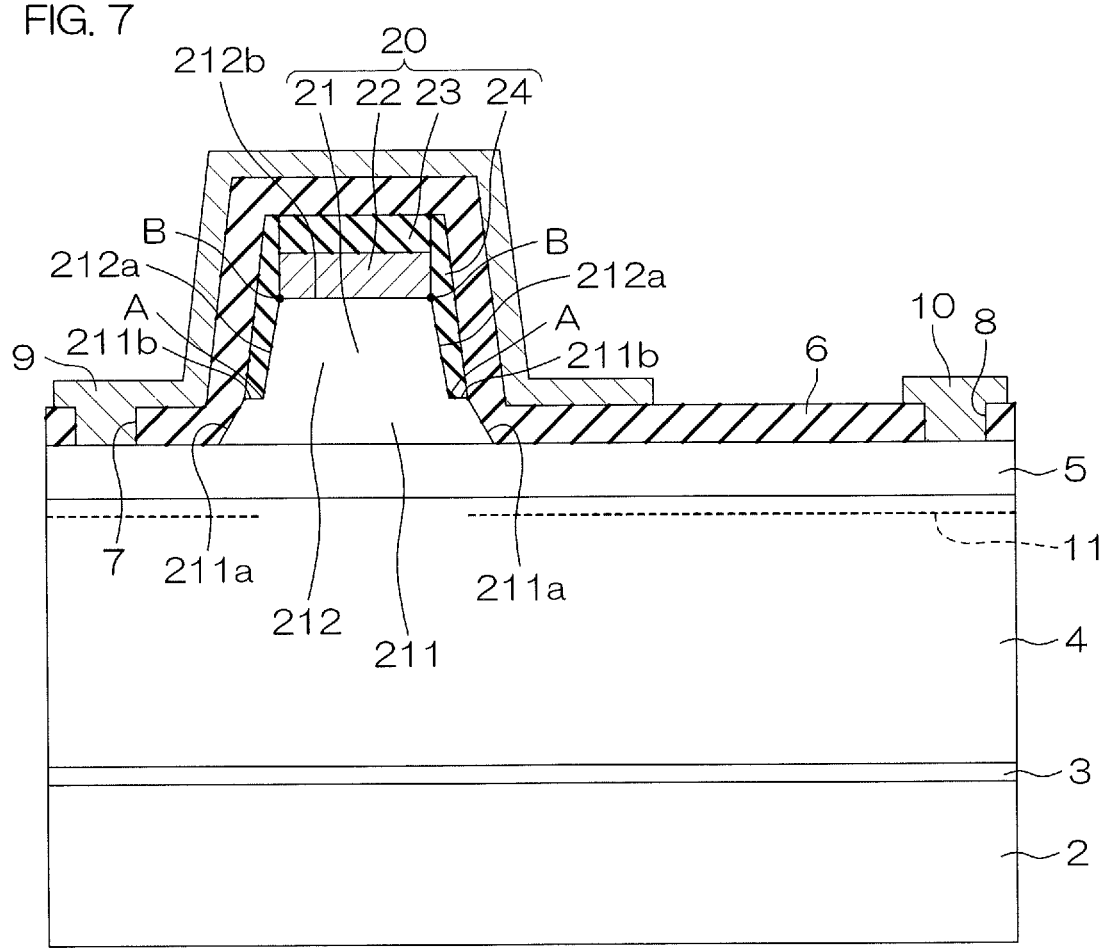
FIG. 7 is a sectional view for describing the arrangement of a nitride semiconductor device according to a fifth preferred embodiment of the present invention.

Referring to FIG. 6 and FIG. 7, with nitride semiconductor devices 1C and 1D according to the fourth and fifth preferred embodiments of the present invention, both side surfaces 211a of the gate layer main body portion 211 are formed to inclined surfaces by which the width of the gate layer main body portion 211 is made gradually narrower toward the gate electrode 22 side. Also, both side surfaces 212a of the upper protruding portion 212 are formed to inclined surfaces by which the width of the upper protruding portion 212 is made gradually narrower toward the gate electrode 22 side.

With the nitride semiconductor device 1C according to the fourth preferred embodiment, an average inclination angle of the side surfaces 211a of the gate layer main body portion 211 with respect to the front surface of the second nitride semiconductor layer 5 is greater than an average inclination angle of the side surfaces 212a of the upper protruding portion 212 with respect to the front surface of the second nitride semiconductor layer 5.

With the nitride semiconductor device 1D according to the fifth preferred embodiment, the average inclination angle of the side surfaces 211a of the gate layer main body portion 211 with respect to the front surface of the second nitride semiconductor layer 5 is less than the average inclination angle of the side surfaces 212a of the upper protruding portion 212 with respect to the front surface of the second nitride semiconductor layer 5.

Although that either of the average inclination angle of the side surfaces 211a of the gate layer main body portion 211 and the average inclination angle of the side surfaces 212a of the upper protruding portion 212 is greater means that etching conditions for structure formation differ, by a region of small plasma damage (a region of high resistance) being present at an intermediate portion of a gate layer side surface, reduction of the gate leak current and suppression of decrease in the rated gate voltage, which is the maximum value applicable to a gate with stability, are enabled.

Figure 8:
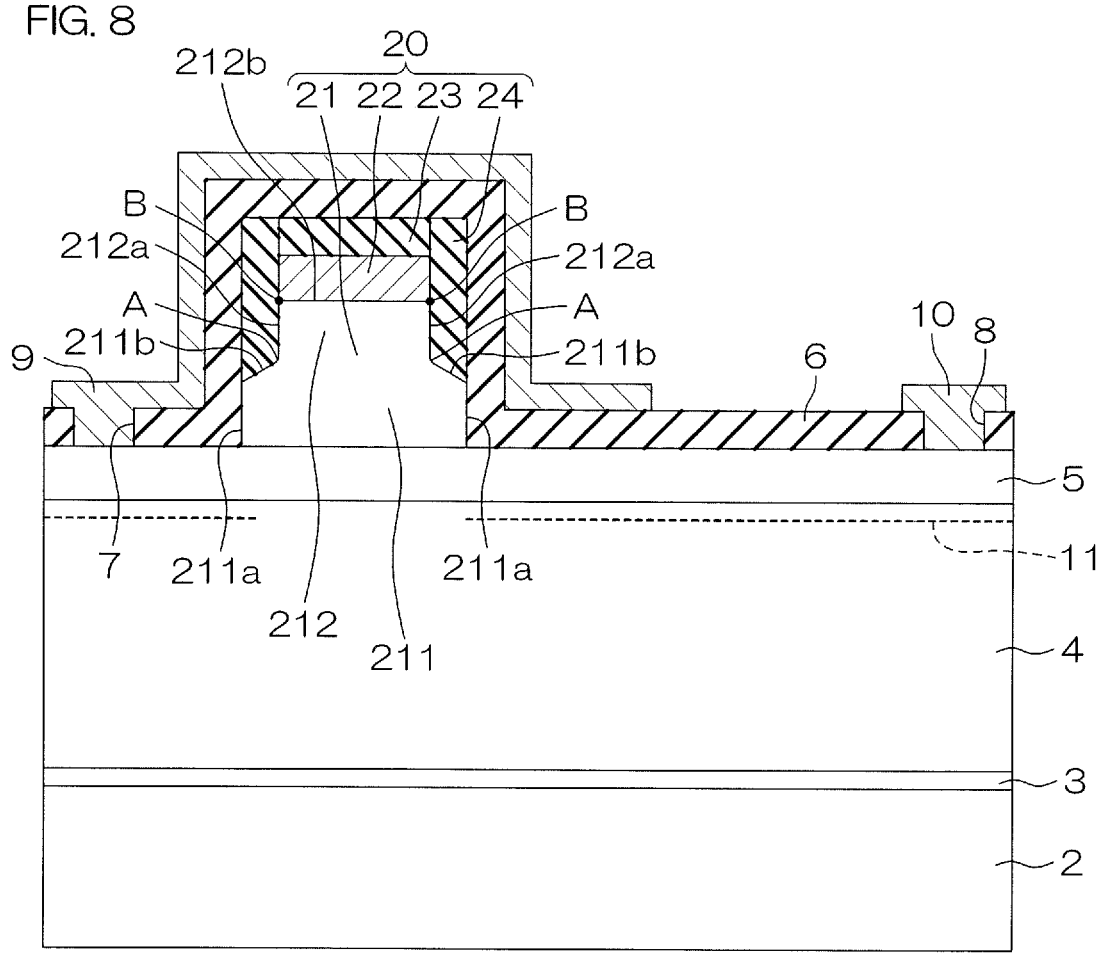
FIG. 8 is a sectional view for describing the arrangement of a nitride semiconductor device according to a sixth preferred embodiment of the present invention.

Referring to FIG. 8, with the nitride semiconductor device 1E according to the sixth preferred embodiment of the present invention, the upper surfaces 211b at both side portions of the gate layer main body portion 211 that respectively connect the lower edges of both side surfaces 212a of the upper protruding portion 212 and the upper edges of corresponding side surfaces 211a of the gate layer main body portion 211 are formed to inclined surfaces by which thicknesses of both side portions of the gate layer main body portion 211 thicken gradually toward a width center of the gate layer main body portion 211.

With the nitride semiconductor device 1E according to the sixth preferred embodiment, electric field concentration at the locations A at which the electric field concentrates can be relaxed in comparison with the nitride semiconductor device 1 according to the first preferred embodiment to enable reduction of the gate leak current and enable suppression of decrease in the rated gate voltage, which is the maximum value applicable to a gate with stability.

Figure 9:
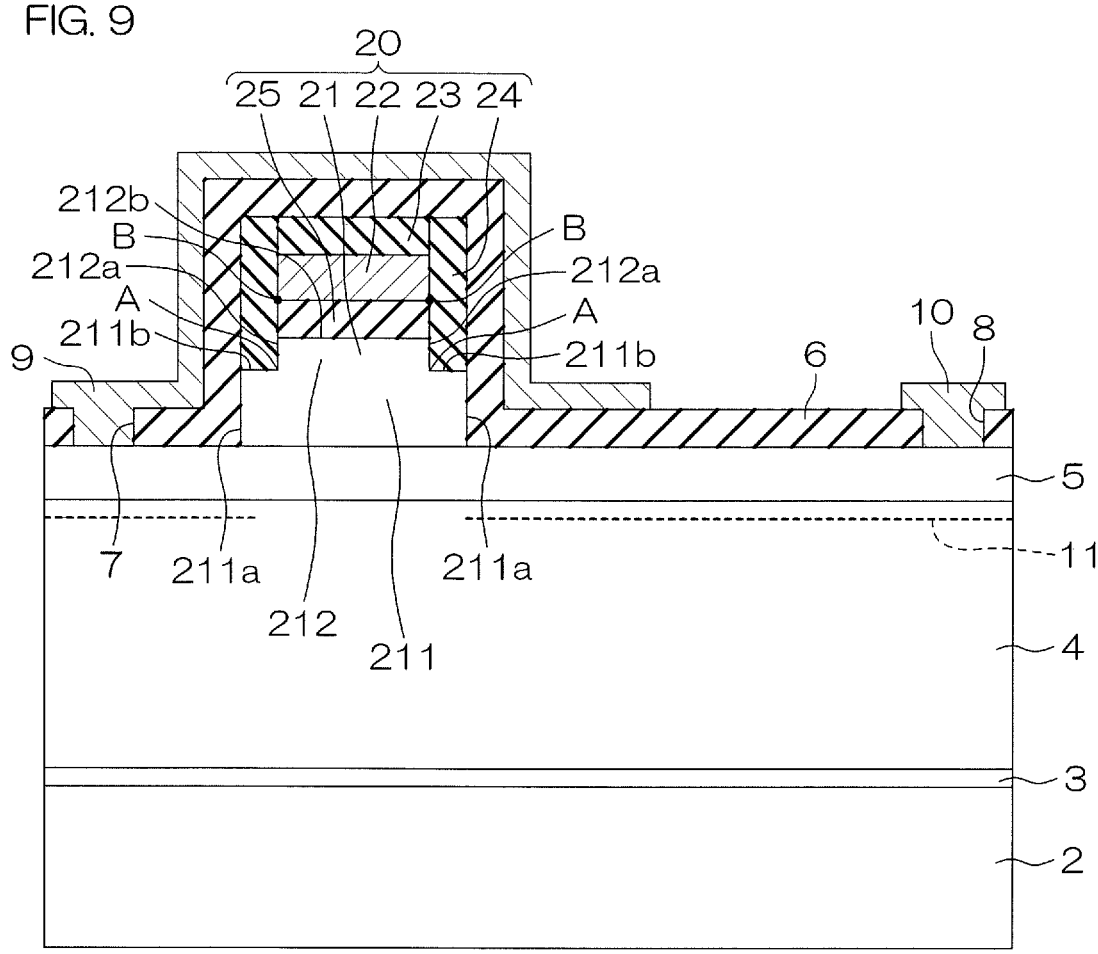
FIG. 9 is a sectional view for describing the arrangement of a nitride semiconductor device according to a seventh preferred embodiment of the present invention.

Referring to FIG. 9, with the nitride semiconductor device 1F according to the seventh preferred embodiment of the present invention, if the semiconductor gate layer 21 is deemed to be a first semiconductor gate layer 21, a second semiconductor gate layer 25 that is constituted of a nitride semiconductor is interposed between the first semiconductor gate layer 21 and the gate electrode 22.

The second semiconductor gate layer 25 is constituted of a nitride semiconductor with a larger bandgap than the first semiconductor gate layer 21. With the seventh preferred embodiment, the second semiconductor gate layer 25 is constituted of an $Al_yGa_{1-y}N$ (0≤y<1, y≥x) layer and a thickness thereof is approximately 10 nm. If the acceptor type impurity implanted in the first semiconductor gate layer 21 is Mg, Mg is implanted in the second semiconductor gate layer 25 by a memory effect.

With the nitride semiconductor device 1E according to the seventh preferred embodiment, a barrier for holes is formed in a valence band at a boundary between the first semiconductor gate layer (pGaN) 21 and the second semiconductor gate layer (AlGaN) 25. Implantation of holes from the gate electrode 22 into the first semiconductor gate layer (pGaN) 21 can thereby be suppressed, thus enabling further reduction of the gate leak current and enabling suppression of decrease in the rated gate voltage, which is the maximum value applicable to a gate with stability.

Figure 10:
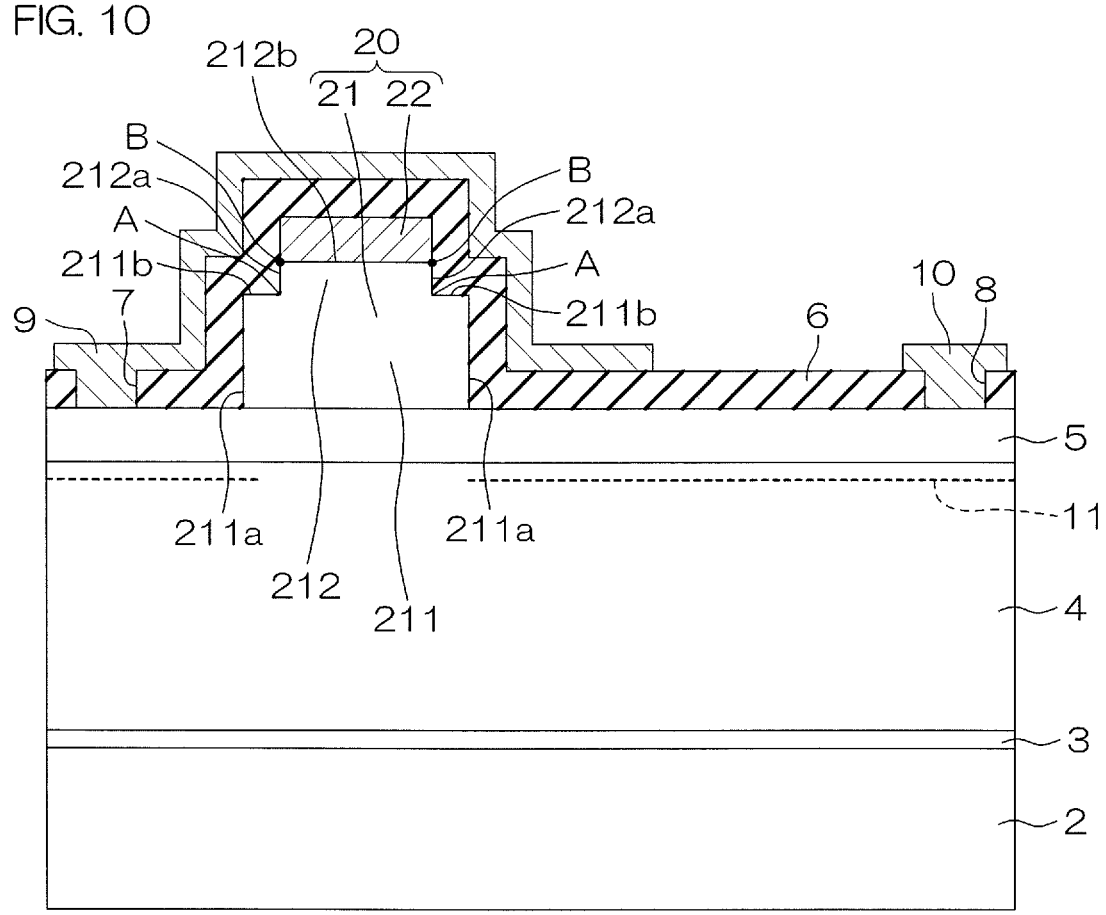
FIG. 10 is a sectional view for describing the arrangement of a nitride semiconductor device according to an eighth preferred embodiment of the present invention.

Referring to FIG. 10, the nitride semiconductor device 1G according to the eighth preferred embodiment of the present invention differs from the nitride semiconductor device 1 in that the top wall 23 and the side walls 24 are not formed. The gate portion 20 is arranged from the semiconductor layer 21 that is constituted of the gate layer main body portion 211 and the upwardly protruding portion 212 and the gate electrode 22 that is formed on the upwardly protruding portion 21.

Although the first to eighth preferred embodiments of the present invention have been described above, the present invention may be implemented in yet other preferred embodiments. For example, although with each of the preferred embodiments described above, silicon was taken up as an example of the material of the substrate 2, any substrate material besides this, such as a sapphire substrate, an insulated substrate, etc., may be applied.

While preferred embodiments of the present invention were described in detail above, these are merely specific examples used to clarify the technical contents of the present invention and the present invention should not be interpreted as being limited to these specific examples and the scope of the present invention is limited only by the appended claims.

The present application corresponds to Japanese Patent Application No. 2019-077283 filed on Apr. 15, 2019 in the Japan Patent Office, and the entire disclosure of this application is incorporated herein by reference.

REFERENCE SIGNS LIST 1, 1A to 1Gnitride semiconductor device
2 substrate
3 buffer layer
4 first nitride semiconductor layer
5 second nitride semiconductor layer
6 passivation film (second dielectric film)
7 source contact hole
8 drain contact hole
9 source electrode
10 drain electrode
11 two-dimensional electron gas (2DEG)
20 gate portion
21 semiconductor gate layer (first semiconductor gate layer)
211 gate layer main body portion
211a side surface
211b upper surface
212 upper protruding portion
212a side surface
212b top surface (upper surface)
22 gate electrode
23 top wall
24 side wall
25 second semiconductor gate layer
71 semiconductor gate material film
72 gate electrode film
73 third dielectric film
74 first dielectric film
75 source/drain electrode film

The invention claimed is:

1. A nitride semiconductor device comprising:
   a first nitride semiconductor layer that constitutes an electron transit layer;
   a second nitride semiconductor layer that is formed on the first nitride semiconductor layer, is larger in bandgap than the first nitride semiconductor layer, and constitutes an electron supply layer; and
   a gate portion that is formed on the second nitride semiconductor layer, wherein
   the gate portion includes
      a semiconductor gate layer of a ridge shape that is formed on the second nitride semiconductor layer and is constituted of a nitride semiconductor containing an acceptor type impurity, and
      a gate electrode that is formed on the semiconductor gate layer,
   the semiconductor gate layer is constituted of:
      a gate layer main body portion that is formed on the second nitride semiconductor layer, and
      an upper protruding portion that is formed on an upper surface of the gate layer main body portion,
   the gate electrode is formed on a top surface of the upper protruding portion, and
   the nitride semiconductor device further comprises:
      a first dielectric film that covers a side surface of the upper protruding portion and the upper surface of the gate layer main body portion connected to a lower edge of the side surface; and
      a second dielectric film that covers a side surface of the gate layer main body portion, an upper surface of the second nitride semiconductor layer, and a whole side surface of the first dielectric film.

2. The nitride semiconductor device according to claim 1, wherein
   a source contact hole and a drain contact hole that penetrate through the second dielectric film in a thickness direction are formed in the second dielectric film, and
   the nitride semiconductor device further comprises a source electrode and a drain electrode that penetrate through the source contact hole and the drain contact hole respectively and are in ohmic contact with the second nitride semiconductor layer.

3. The nitride semiconductor device according to claim 1, wherein a thickness of the upper protruding portion is thinner than a thickness of the gate layer main body portion.

4. The nitride semiconductor device according to claim 1, wherein a thickness of the upper protruding portion is thicker than a thickness of the gate layer main body portion.

5. The nitride semiconductor device according to claim 1, wherein
   both side surfaces of the gate layer main body portion are inclined toward the gate electrode, and
   both side surfaces of the upper protruding portion are inclined toward the gate electrode side.

6. The nitride semiconductor device according to claim 5, wherein an average inclination angle of the side surfaces of the gate layer main body portion differs from an average inclination angle of the side surfaces of the upper protruding portion.

7. The nitride semiconductor device according to claim 1, wherein upper surfaces of both side portions of the gate layer main body portion, that respectively connect lower edges of both side surfaces of the upper protruding portion and upper edges of the corresponding side surfaces of the gate layer main body portion, are inclined toward a center of the upper protruding portion.

8. The nitride semiconductor device according to claim 1, wherein the gate electrode is formed so as to cover the entire top surface of the upper protruding portion.

9. The nitride semiconductor device according to claim 1, wherein, in plan view, both side edges of a lower surface of the gate electrode are receded further inward than corresponding side edges of the top surface of the upper protruding portion.

10. The nitride semiconductor device according to claim 1, wherein
the first nitride semiconductor layer is constituted of a GaN layer,
the second nitride semiconductor layer is constituted of an $Al_xGa_{1-x}N$ (0<x≤1) layer, and
the semiconductor gate layer is constituted of a p type GaN layer.

11. The nitride semiconductor device according to claim 1, wherein, if the semiconductor gate layer is deemed to be a first semiconductor gate layer, a second semiconductor gate layer that is constituted of a nitride semiconductor with a larger bandgap than the first semiconductor gate layer is interposed between the first semiconductor gate layer and the gate electrode.

12. The nitride semiconductor device according to claim 10, wherein, if the semiconductor gate layer is deemed to be a first semiconductor gate layer,
a second semiconductor gate layer that is constituted of a nitride semiconductor is interposed between the first semiconductor gate layer and the gate electrode, and
the second semiconductor gate layer is constituted of an $Al_yGa_{1-y}N(0≤y<1,\ y≤x)$ layer.

13. The nitride semiconductor device according to claim 1, wherein the gate electrode is constituted of a single film that is any one of a Ti film, a TiN film, and a TiW film or of a composite film constituted of any combination of two or more of the films.

14. The nitride semiconductor device according to claim 1, further comprising a third dielectric film that is formed on an upper surface of the gate electrode.

15. The nitride semiconductor device according to claim 1, further comprising a third dielectric layer film that is formed on an upper surface of the gate electrode,
wherein a thickness of the third dielectric film is thicker than a thickness of the second dielectric film.

16. The nitride semiconductor device according to claim 1, wherein the first dielectric film and the second dielectric film are each constituted of a single film that is any one of an SiN film, an $SiO_2$ film, an SiON film, an $Al_2O_3$ film, an AlN film, and an AlON film or of a composite film constituted of any combination of two or more of the films.

17. The nitride semiconductor device according to claim 16, wherein the first dielectric film and the second dielectric film are constituted of the same material.

18. The nitride semiconductor device according to claim 16, wherein the first dielectric film and the second dielectric layer film are constituted of different materials.

19. The nitride semiconductor device according to claim 1, further comprising a third dielectric film that is formed on an upper surface of the gate electrode,
wherein the second dielectric film covers an upper surface of the third dielectric film.

* * * * *